(12) United States Patent
Chang et al.

(10) Patent No.: US 8,778,800 B1
(45) Date of Patent: Jul. 15, 2014

(54) METHODS OF MAKING SUPERCAPACITOR CELLS AND MICRO-SUPERCAPACITORS

(71) Applicants: David T. Chang, Calabasas, CA (US); Pamela R. Patterson, Los Angeles, CA (US); Ping Liu, Irvine, CA (US)

(72) Inventors: David T. Chang, Calabasas, CA (US); Pamela R. Patterson, Los Angeles, CA (US); Ping Liu, Irvine, CA (US)

(73) Assignee: HRL Laboratories, LLC, Malibu, CA (US)

( * ) Notice: Subject to any disclaimer, the term of this patent is extended or adjusted under 35 U.S.C. 154(b) by 74 days.

(21) Appl. No.: 13/887,370

(22) Filed: May 6, 2013

Related U.S. Application Data

(62) Division of application No. 13/070,467, filed on Mar. 23, 2011, now Pat. No. 8,503,161.

(51) Int. Cl.
*H01L 21/44* (2006.01)
(52) U.S. Cl.
USPC .......................................... 438/685
(58) Field of Classification Search
CPC ........ B82Y 10/00; H01G 9/155; Y02E 60/13; Y02T 10/7022; Y10S 977/948
See application file for complete search history.

(56) References Cited

U.S. PATENT DOCUMENTS

| | | | |
|---|---|---|---|
| 5,199,917 A * | 4/1993 | MacDonald et al. | 445/24 |
| 6,454,816 B1 * | 9/2002 | Lee et al. | 29/25.03 |
| 6,621,687 B2 | 9/2003 | Lewis, Jr. et al. | |
| 7,061,749 B2 | 6/2006 | Liu et al. | |
| 7,067,407 B2 * | 6/2006 | Kostamo et al. | 438/584 |
| 7,324,328 B2 | 1/2008 | Narendra et al. | |
| 2008/0010796 A1 | 1/2008 | Pan et al. | |
| 2008/0013258 A1 | 1/2008 | Viswanathan et al. | |
| 2008/0254362 A1 | 10/2008 | Raffaelle et al. | |

* cited by examiner

*Primary Examiner* — Charles Garber
*Assistant Examiner* — Andre' C Stevenson
(74) *Attorney, Agent, or Firm* — O'Connor & Company

(57) ABSTRACT

This invention provides a micro-supercapacitor with high energy density and high power density. In some variations, carbon nanostructures, such as carbon nanotubes, coated with a metal oxide, such as ruthenium oxide, are grown in a supercapacitor cavity that contains no separator. A lid is bonded to the cavity using a bonding process to form a hermetic seal. These micro-supercapacitors may be fabricated from silicon-on-insulator wafers according to the disclosed methods. An exemplary micro-supercapacitor is cubic with a length of about 50-100 μm. The absence of a separator translates to higher energy storage volume and less wasted space within the supercapacitor cell. The energy density of the micro-supercapacitor may exceed 150 J/cm$^3$ and the peak output power density may be in the range of about 2-20 W/cm$^3$, in various embodiments.

7 Claims, 15 Drawing Sheets

METHODS OF MAKING SUPERCAPACITOR CELLS AND MICRO-SUPERCAPACITORS

PRIORITY DATA

This patent application is a divisional application of U.S. patent application Ser. No. 13/070,467, filed Mar. 23, 2011, which is hereby incorporated by reference herein.

STATEMENT REGARDING FEDERALLY SPONSORED RESEARCH OR DEVELOPMENT

This invention was made with Government support under Contract No. FA8650-06-C-7621. The Government has certain rights in this invention.

FIELD OF THE INVENTION

The present invention generally relates to supercapacitors and energy-storage and energy-delivery devices that include supercapacitor structures.

BACKGROUND OF THE INVENTION

Energy has become a primary focus throughout the world. There has been great interest in developing more efficient energy-storage devices. A supercapacitor is a type of energy-storage device with a broad spectrum of potential uses. In particular, supercapacitors have great potential for applications that require a combination of high power, short charging time, high cycling stability, and long shelf life.

Supercapacitors, also known as ultracapacitors or electrochemical capacitors, generally can achieve capacitances several orders of magnitude larger than conventional capacitors. Supercapacitors are thus able to attain greater energy densities while still maintaining the characteristic high power density of conventional capacitors.

The performance of a supercapacitor can be evaluated in terms of its energy density, the amount of energy that can be stored per unit volume; and in terms of its power density, the rate at which an amount of energy can be transferred in or out of that unit volume. Supercapacitors, generally speaking, have several advantages over electrochemical batteries and fuel cells, including higher power density, shorter charging times, and longer cycle life. Despite greater capacitances than conventional capacitors, supercapacitors have yet to match the energy densities of many batteries and fuel cells.

Conventional capacitors have relatively high power densities, but relatively low energy densities when compared to electrochemical batteries and to fuel cells. That is, a battery can store more total energy than a capacitor, but it cannot deliver it very quickly—which means its power density is low. Capacitors, on the other hand, store relatively less energy per unit mass or volume, but what electrical energy they do store can be discharged rapidly to produce a lot of power—which means their power density is usually high.

Supercapacitors are generally known in the art. Yet, many of the emerging applications for supercapacitors require them to be very small, such as about 100 μm or less in any dimension. Such very small supercapacitors may be referred to as micro-supercapacitors. Typical micro-supercapacitors employ cell separators which take up valuable cavity space in a sub-100 μm size device, and thus reduce the energy capacity of the supercapacitor.

There remains a need for micro-supercapacitors with high energy densities and high power densities, resulting from fast ionic and electronic capacitance. Preferably, the micro-supercapacitor contains no separator, to maximize working volume and energy density. What is desired is a micro-supercapacitor that can be fabricated and hermetically sealed for practical use in a variety of applications.

SUMMARY OF THE INVENTION

The present invention addresses the aforementioned needs in the art, as will now be summarized and then further described in detail below.

In some variations, the present invention provides a method of fabricating a supercapacitor, the method comprising:

(a) etching a first silicon-on-insulator wafer to form a cavity and a cavity border surface;

(b) depositing a first electrode interconnect metal onto the internal surface of the cavity and onto the cavity border surface;

(c) depositing, at the bottom of the cavity and onto a portion of the first electrode interconnect metal, a first catalyst layer for catalyzing growth of carbon nanostructures;

(d) depositing, onto the surface of a second silicon-on-insulator wafer, a second electrode interconnect metal and a second catalyst layer, to form a lid layer;

(e) growing carbon nanostructures on the first catalyst layer and on the second catalyst layer;

(f) depositing a metal oxide onto the outer surfaces of the carbon nanostructures;

(g) introducing an electrolyte or electrolyte precursor into the cavity;

(h) applying a bonding material between the cavity border surface and the lid layer;

(i) aligning the lid layer with the cavity border surface under suitable bonding conditions for the bonding material to form a hermetic seal;

(j) removing lid silicon substrate and lid insulator from the lid layer;

(k) etching a first electrode via and a second electrode via in the lid layer, wherein the first electrode via exposes the first electrode interconnect metal on the cavity border surface and the second electrode via exposes the second electrode interconnect metal; and (l) depositing a first electrode metal terminal and a second electrode metal terminal on the lid layer.

The carbon nanostructures may be selected from the group consisting of nanotubes, nanohorns, nanowires, nanofoams, nanoribbons, nanofibers, buckytubes, extruded activated carbon, oriented pyrolytic graphite, aerogels, graphene sheets, and any combinations thereof. In some embodiments, the carbon nanostructures are single-wall carbon nanotubes.

The metal oxide may be selected from the group consisting of ruthenium oxide, manganese oxide, nickel oxide, cobalt oxide, tungsten oxide, vanadium oxide, and any combinations thereof, for example.

The bonding material may be selected from the group consisting of benzocyclobutene, benzocyclopropene, benzocyclobutadiene, 1,2,5,6-dibenzocyclooctadiene, divinylsiloxane bis(benzocyclobutene), an epoxy, and any combinations thereof, for example. In some embodiments, bonding is carried out at a temperature less than about 40° C.

In some embodiments, the etching in step (a) includes formation of a via platform within the cavity border surface, wherein the via platform connects the first electrode via to the first electrode interconnect metal.

Variations of the invention provide a supercapacitor comprising:

(a) a cavity internally coated with a first electrode interconnect metal;

(b) a lid coated with a second electrode interconnect metal disposed on a side facing toward the cavity, wherein the lid and the cavity form a hermetic seal;

(c) first carbon nanostructures electrically continuous with a portion of the first electrode interconnect metal;

(d) second carbon nanostructures electrically continuous with a portion of the second electrode interconnect metal;

(e) metal oxide coating on outer surfaces of the first and second carbon nanostructures;

(f) an electrolyte within the cavity;

(g) a first electrode via in the lid, wherein the first electrode via exposes the first electrode interconnect metal on a border surface of the cavity;

(h) a second electrode via in the lid, wherein the second electrode via exposes the second electrode interconnect metal; and (i) a first electrode metal terminal and a second electrode metal terminal each disposed on the lid, wherein the first electrode metal terminal connects through the first electrode via to the first electrode interconnect metal, and wherein the second electrode metal terminal connects through the second electrode via to the second electrode interconnect metal.

Preferably, the supercapacitor does not include a cell separator.

In some embodiments, the cavity and the lid each comprise silicon. In certain embodiments, the cavity includes a slope in one or more walls of the cavity.

The first and second carbon nanostructures may each be independently selected from the group consisting of nanotubes, nanohorns, nanowires, nanofoams, nanoribbons, nanofibers, buckytubes, extruded activated carbon, oriented pyrolytic graphite, aerogels, graphene sheets, and any combinations thereof.

The first and second carbon nanostructures may be connected to catalyst layers comprising one or more catalysts selected from the group consisting of iron, nickel, cobalt, and yttrium.

In some embodiments, the first and second carbon nanostructures are single-wall carbon nanotubes connected substantially perpendicularly to an iron catalyst layer that is disposed onto the first and second electrode interconnect metals.

The metal oxide may be selected from, for example (without limitation of the invention), ruthenium oxide, manganese oxide, nickel oxide, cobalt oxide, tungsten oxide, vanadium oxide, or any combinations thereof.

The first electrode interconnect metal and the second electrode interconnect metal may each be independently selected from gold, copper, silver, and any combinations or alloys thereof.

In some embodiments, the electrolyte is a liquid electrolyte. In other embodiments, the electrolyte is a solid electrolyte.

The supercapacitor has at least one dimension less than 1 mm, such as less than 100 μm, in some embodiments of the invention. The supercapacitor may have a depth-to-width ratio of at least 2, if desired.

In certain embodiments, a supercapacitor is provided with at least one length dimension less than 100 μm, the supercapacitor comprising:

(a) a sloped silicon cavity internally coated with a first metal;

(b) a silicon lid, coated with a second metal, and disposed on a side facing into the cavity, wherein the lid and the cavity form a hermetic seal;

(c) first carbon nanotubes electrically continuous with the first metal;

(d) second carbon nanotubes electrically continuous with the second metal;

(e) ruthenium oxide coating on outer surfaces of the first and second carbon nanotubes;

(f) an electrolyte within the cavity;

(g) a first electrode via in the lid, wherein the first electrode via exposes a region of the first metal on a border surface of the cavity;

(h) a second electrode via in the lid, wherein the second electrode via exposes a region of the second metal; and (i) a first electrode metal terminal and a second electrode metal terminal each disposed on the lid, wherein the first electrode metal terminal connects through the first electrode via to the region of first metal, wherein the second electrode metal terminal connects through the second electrode via to the region of second metal, and wherein the supercapacitor does not include a cell separator.

DETAILED DESCRIPTION OF EMBODIMENTS OF THE INVENTION

The apparatus, devices, systems, and methods of the present invention will now be described in detail by reference to various non-limiting embodiments, including the figures which are exemplary only.

Unless otherwise indicated, all numbers expressing dimensions, capacities, and so forth used in the specification and claims are to be understood as being modified in all instances by the term "about." Without limiting the application of the doctrine of equivalents to the scope of the claims, each numerical parameter should at least be construed in light of the number of reported significant digits and by applying ordinary rounding techniques.

As used in this specification and the appended claims, the singular forms "a," "an," and "the" include plural referents unless the context clearly indicates otherwise.

Figure 1A:
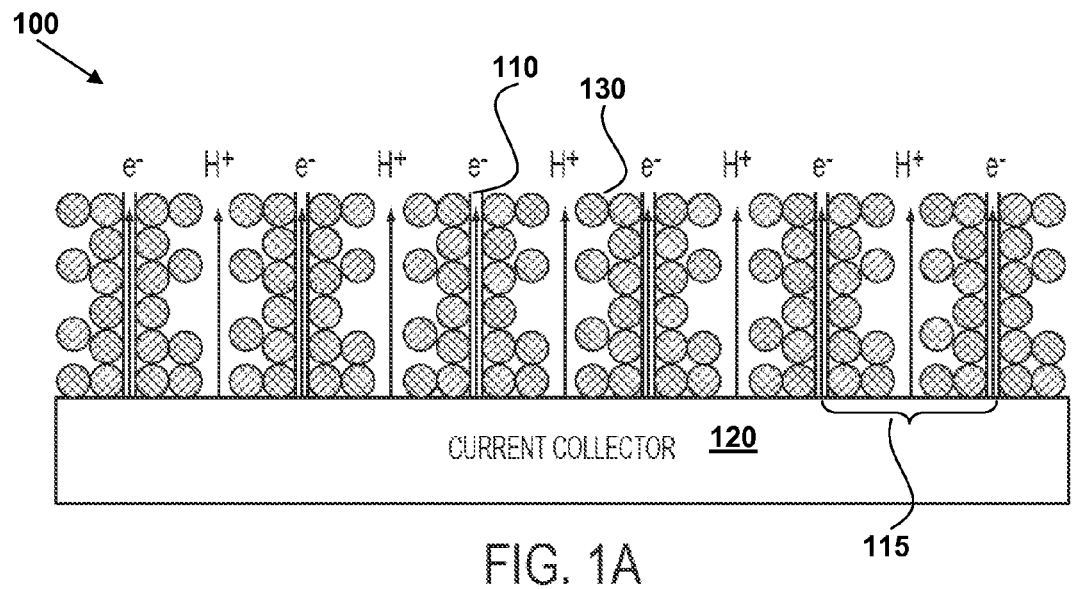
FIG. 1A depicts an aligned carbon nanotube/ruthenium oxide composite structure for a supercapacitor cell, in some embodiments of the invention.

Some variations of the invention utilize a composite structure 100 for good energy and power density in a supercapacitor, as depicted in FIG. 1A. In these variations, carbon nanotubes 110 are grown directly on a metal current collector 120 which provides a low-resistance interface for conduction of electrons through the carbon nanotubes 110. The nanotubes 110 are substantially aligned, i.e., perpendicular from the surface of the current collector 120. Metal oxide nanoparticles 130, such as ruthenium oxide nanoparticles, are deposited on the carbon nanotubes, and the residual volume 140 (between nanotubes) is filled with electrolyte to provide good proton conduction. This composite structure 100 offers efficient proton and electron transport pathways, which provides high power density.

Carbon nanotubes are generally categorized as single-wall carbon nanotubes (SWNT) and multi-wall carbon nanotubes (MWNT). Single-wall carbon nanotubes are fullerenes consisting essentially of $sp^2$-hybridized carbon typically arranged in hexagons and pentagons. These carbon cylindrical structures, known also as "buckytubes," have extraordinary properties, including high electrical and thermal conductivity, as well as high strength and stiffness.

Multi-wall carbon nanotubes are nested single-wall carbon cylinders and possess some properties similar to single-wall carbon nanotubes. However, since single-wall carbon nanotubes typically have fewer defects than multi-wall carbon nanotubes, single-wall carbon nanotubes are generally stronger and more conductive. Additionally, single-wall carbon nanotubes have considerably higher available surface area per gram of carbon than multi-wall carbon nanotubes. Therefore, when carbon nanotubes are employed in the present invention, the nanotubes are preferably single-wall carbon nanotubes.

Single-wall carbon nanotubes can be made from any known means, such as by gas-phase synthesis from high temperature, high-pressure carbon monoxide, catalytic vapor deposition using carbon-containing feedstocks and metal catalyst particles, laser ablation, an arc-discharge method, or any other method for synthesizing single-wall carbon nanotubes.

With reference to exemplary FIG. 1A, the carbon nanotubes 110 can have outer diameters ranging from about 0.5 nm to about 100 nm, such as about 1 nm to about 10 nm. The carbon nanotubes 110 can have average lengths ranging from, for example, about 100 nm to about 1 µm, 10 µm, 100 µm, 1 mm, 10 mm, 100 mm, or even longer. It is well-known that very large length-to-diameter ratios are possible with carbon nanotubes.

The carbon nanotubes 110 may be augmented with one or more functional groups 140 (FIG. 1B), such as alkyl, acyl, aryl, halogen; substituted or unsubstituted thiol; unsubstituted or substituted amino; hydroxy; and a linear or cyclic carbon chain. Typically, the number of carbon atoms in the alkyl, acyl, or aryl groups is in the range of 1 to about 10.

The present invention is not limited to carbon nanotubes in a composite structure. In various embodiments, carbon nanostructures are grown directly or otherwise attached to a current collector. "Carbon nanostructures" include any carbon forms with at least one dimension on the order of 1 µm or less. Examples of carbon nanostructures include, but are not limited to, carbon single-wall nanotubes, multi-wall nanotubes, nanohorns, nanowires, nanofoam, or nanoribbon; buckytubes; carbon fibers; activated carbon (including extruded activated carbon); oriented pyrolytic graphite; carbon aerogels; and various forms of graphene, such as vertically aligned graphene sheets.

Carbon nanostructures can be directly grown on a metal substrate using thermal chemical deposition, microwave plasma chemical deposition, arc-discharge, or laser vaporization synthesis, for example. The synthesis conditions (e.g., temperature, pressure, carrier gas, etc.), metal catalyst type (for carbon nucleation), and carbon source (e.g., graphite or hydrocarbon) are all known to influence the properties of the resulting carbon nanostructures.

Metal oxide nanoparticles 130 are deposited on the carbon nanostructures 110, such as depicted in FIG. 1A. The metal oxide 130 should be selected for the capability to transport protons and to support high device capacitance and power density. In some embodiments, the metal oxide is selected from ruthenium oxide ($RuO_2$); manganese oxide (such as manganese(II,III) oxide, $Mn_3O_4$); nickel oxide (NiO); cobalt oxide (such as cobalt(II,III) oxide, $Co_3O_4$); tungsten oxide (such as tungsten(VI) oxide, $WO_3$); vanadium oxide (such as vanadium(V) oxide, $V_2O_5$); and any combinations thereof. In preferred embodiments, the metal oxide is ruthenium oxide.

The thickness of the metal oxide 130 coating on the carbon nanostructures 110 can be from about 5 nm to about 100 nm, such as from about 10 nm to about 50 nm. The distance between nanostructures 110 (for example, the separation 115 between nanotubes in FIG. 1A) can be from about 10 nm to about 200 nm, such as from about 20 nm to about 100 nm.

The density of the metal oxide 130 may vary, provided there is sufficient porosity for the electrolyte to conduct protons. Typically, although not necessarily, the density of the metal oxide 130 will be higher near the carbon nanostructure 110 surfaces compared to the space between nanostructures.

Figure 1B:
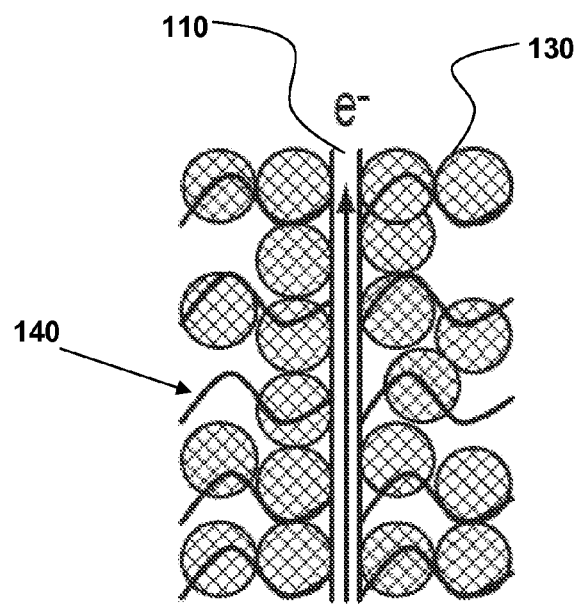
FIG. 1B shows a variation of FIG. 1A, wherein surface ion conducting groups are included to enhance ion conduction.

In some embodiments, the surface of the carbon nanostructures 110 is modified with ionic conducting groups 140 that can enhance the adhesion of metal oxide nanoparticles, to provide additional proton conduction pathways. FIG. 1B depicts a modification of the composite structure 100 of FIG. 1A, where the curved lines in FIG. 1B indicate ionic conducting groups 140 added to the nanostructure 110. An example of a surface ionic conducting group 140 is phenylsulfonate, derived from phenylsulfonic acid ($C_6H_5O_3S$).

An electrolyte will be present in a supercapacitor employing the composite structure of FIG. 1A or variations thereof. The electrolyte provides a charge reservoir for the supercapacitor (electrolyte not shown). The specific electrolyte selected determines the operating voltage of the supercapacitor, which contributes to the stored energy, but generally speaking the choice of electrolyte is not limited or critical to the present invention. Various solid and fluid (liquid) materials are suitable for the electrolyte.

Fluid electrolytes in supercapacitors may be aqueous or organic. In aqueous systems, sulfuric acid, potassium hydroxide, and sodium hydroxide may be used, for example. Organic electrolytes generally have lower conductivity but can withstand higher operating voltages due to higher electrochemical decomposition limits than those of aqueous electrolytes. Tetraalkylammonium salts, also known as quaternary ammonium salts, have good solubility in non-aqueous solvents and fairly good conductivity. Non-aqueous, dipolar aprotic solvents with high dielectric constants, such as organic carbonates, may be utilized. Examples of suitable organic carbonates are ethylene carbonate, propylene carbonate, propanediol-1,2-carbonate, and dichloroethylene carbonate.

Polymer gel electrolytes have high electrical potential resistance. Polymer gel electrolytes are polymer-electrolyte systems, in which the polymer forms a matrix for the electrolyte species. A plasticizer can also be a component of the polymer-electrolyte system. Examples of suitable polymer gel electrolytes include, but are not limited to, polyurethane-$LiCF_3SO_3$, polyurethane-lithium perchlorate, polyvinylacohol-KOH—$H_2O$, poly(acrylonitrile)-lithium salts, and poly(acrylonitrile)-quaternary ammonium salts.

When the electrolyte is a solid, it may be chemically bonded or physically adsorbed with the metal oxide or the carbon nanostructures, or it may form a distinct phase within the structure.

In some variations of the invention, dual silicon-on-insulator (SOI) wafers are utilized to create a cavity for the electrolyte, on a cavity wafer, and to provide a substrate for the growth of electrodes on both the cavity wafer and on a lid wafer. SOI technology generally refers to the use of a layered silicon-insulator-silicon substrate in place of conventional silicon substrates to reduce parasitic device capacitance and thereby improve performance. As is known, SOI substrates are compatible with most conventional fabrication processes.

The insulator material in an SOI wafer may be any known insulator, but typically the insulator is primarily silicon dioxide ($SiO_2$) or aluminum oxide ($Al_2O_3$). The insulator layer may be referred to as a "buried insulator" layer or "buried oxide" layer. The silicon layer that is disposed above the buried insulator layer, and exposed on the wafer surface, may be referred to as the device layer. The bulk silicon layer that is disposed on the opposite side may be referred to as the substrate layer.

By employing dual SOI wafers (i.e., both a cavity wafer and a lid wafer), as described below, several advantages may result in various embodiments. First, relatively high-temperature processes may be completed prior to introducing an electrolyte into the cavity.

Second, precise control of the micro-supercapacitor total thickness is possible, because the cavity and lid are both derived from device layers of the SOI wafers. Device layers in SOI wafers are typically known with good precision, and can be fabricated with good accuracy to achieve a desired thickness.

Third, a very thin lid layer is possible, such as about 10 µm, 5 µm, 2 µm, 1 µm, or even less. Thus the volume of the supercapacitor is substantially determined on the cavity side, allowing precise control of the supercapacitor volume.

Fourth, dual SOI wafers permit the use of known backside alignment tools for high accuracy, thereby allowing a via to penetrate the sealing surface while retaining a hermetic seal, as described in some embodiments below.

It should be noted that the present invention may be practiced by implementing method steps in different orders than as specifically set forth herein. By changing the order of one or more steps relative to other steps, in some embodiments the same final structure or device may be produced, while in other embodiments a different final structure or device is produced, yet still within the scope of the claimed invention.

All references to a "step" may include multiple steps (or substeps) within the meaning of a step. Likewise, all references to "steps" in plural form may also be construed as a single process step or various combinations of steps.

In some variations, an exemplary micro-supercapacitor can be produced according to the following steps. The figures are meant to be exemplary only, and should not be construed to limit the scope of the invention. The figures relate to method steps as well as to structures produced by the disclosed methods, or by other methods.

A micro-supercapacitor can be formed by first producing a cavity (lower electrode) and a lid (upper electrode), and then combining the cavity and lid to form a sealed supercapacitor. One possible implementation to fabricate a supercapacitor cavity wafer (lower electrode) is shown in FIGS. 2A-2F which are three-dimensional cross-section sketches illustrating various steps. For convenience of illustration, FIGS. 2A-2F represent a single micro-supercapacitor cell. It should be understood that commercial processing would typically be performed on whole wafers, followed by formation of a plurality of individual micro-supercapacitors. Of course, it would be possible to actually perform these steps on partial wafers or even single cells.

The starting material is an SOI wafer (silicon/$SiO_2$) with a device layer 210 having a thickness of, for example, about 48 µm to 50 µm. The SOI wafer may be patterned with conventional photoresist and transferred into the silicon using an etch process, to form the structure 200 in FIG. 2A. Either (or both) wet etching or dry etching may be utilized for this step. The depth of the cavity 220 may be controlled using the etching time and the etch rate, which will depend on the etchant(s) selected. Exemplary wet etchants for silicon include nitric acid and hydrofluoric acid.

In some embodiments, a dry-etch process enables better control of the feature geometry, compared to a wet-etch process. Dry etching removes a masked pattern of semiconductor material by exposing the material to a bombardment of ions. The ions usually consist of a plasma of reactive gases such as fluorocarbons, oxygen, chlorine, and/or boron trichloride, for example, that dislodge portions of the material from the exposed surface. The dry etching process typically etches directionally or anisotropically.

In some embodiments, a slight slope is desired in one or more of the silicon walls 230 within the cavity, as suggested in FIGS. 2A-2F. The slope may be uniform, although that is not necessary. Sloped walls 230 may be achieved using wet etching or dry etching; dry etching is expected to provide better control to achieve a selected slope. In some embodiments, the silicon cavity walls are not sloped, in order to maximize cavity volume or for other reasons.

In the embodiment depicted in FIGS. 2A-2F, a small platform 240 is included in the back corner of the cavity. This platform 240 provides a landing for a via 420 to connect the cavity electrode 440 (see FIG. 4C). The platform 240 location is convenient because it will not be later covered by the bonding material 290 that bonds the lid to the cavity. Many other platform locations are possible. In alternative embodiments, rather than a separate feature for a platform, a region of the border 250 (top surface) of the cavity may be reserved for the via 420.

Figure 2A:
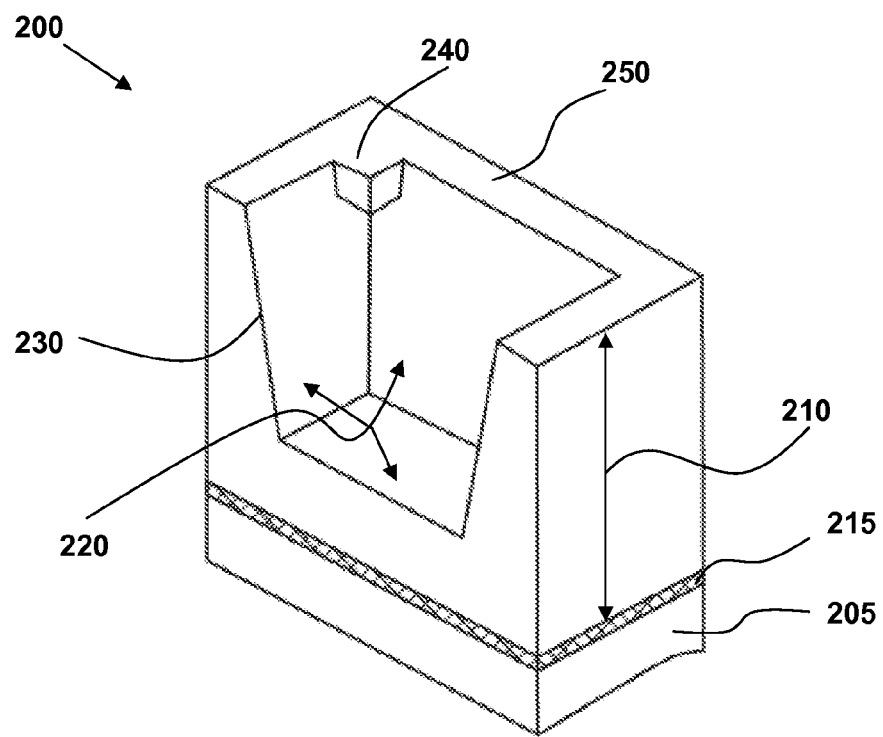
FIG. 2A illustrates a first step of fabricating a supercapacitor cavity from a silicon wafer using an etch process, in some embodiments.
Figure 2B:
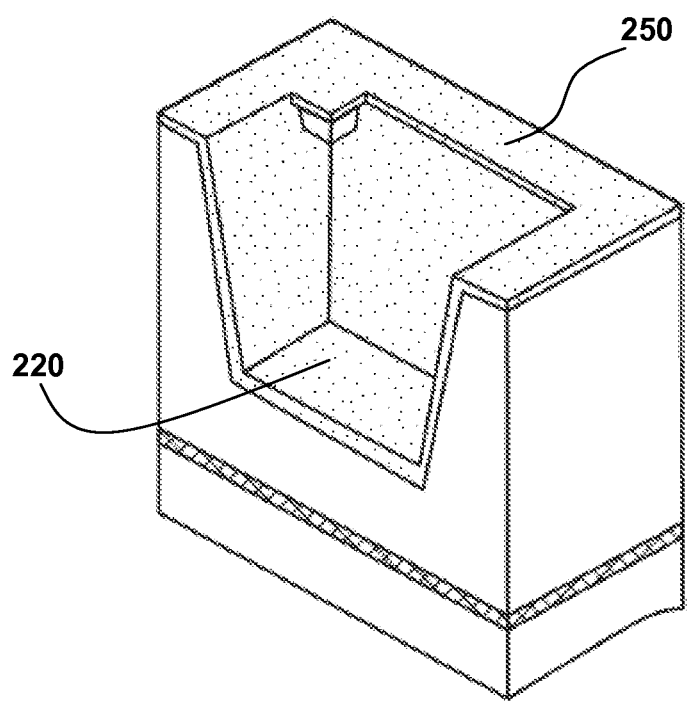
FIG. 2B illustrates a step of depositing metal on the internal surface and border of the supercapacitor cavity, in some embodiments.

As depicted in FIG. 2B, metal is deposited on the surface 220 within the cavity and onto the surrounding border 250.

The method of metallization may be selected to maximize the coverage. When the aspect ratio is not too severe (i.e., the cavity depth is not large relative to the cavity width), a metal sputtering or metal plating may be used to form a film of metal. The metal should be a conductor that is compatible with the temperature for deposition of carbon nanotubes. The metal may be selected from gold, copper, silver, or any combinations or alloys thereof.

Figure 2C:
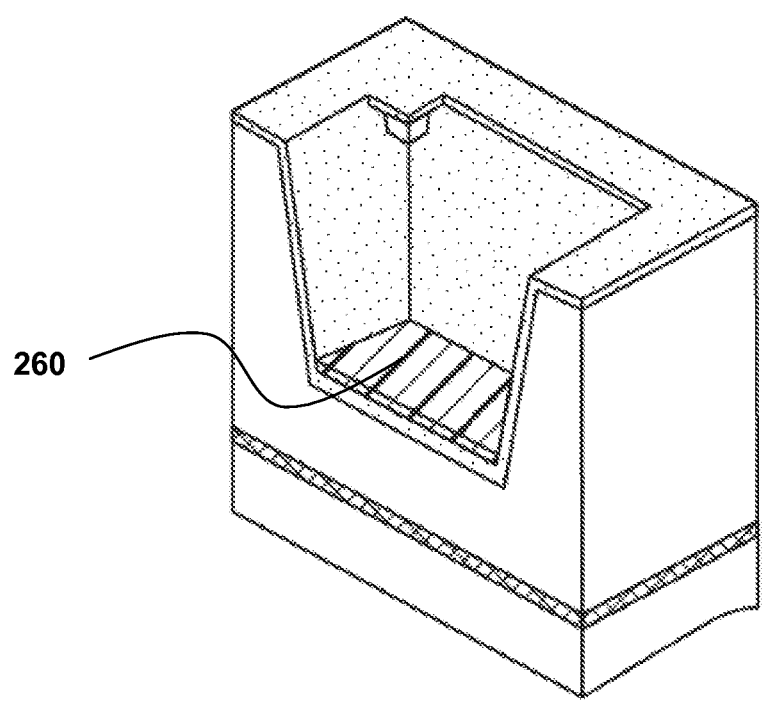
FIG. 2C illustrates a step of depositing a suitable catalyst layer for nucleating growth of carbon nanotubes, in some embodiments.

A suitable catalyst layer 260 is deposited onto the bottom of the cavity, as shown in FIG. 2C. The catalyst layer 260 may be iron, nickel, cobalt, or yttrium, for example, and deposited by electron-beam evaporation or another technique. This catalyst layer 260 is capable of nucleating subsequent growth of carbon nanotubes. This step may employ a photoresist lift-off process. Possible techniques may utilize a negative resist, a solid thin film resist, or a shadow mask. The alignment accuracy at this step is not critical.

Figure 2D:
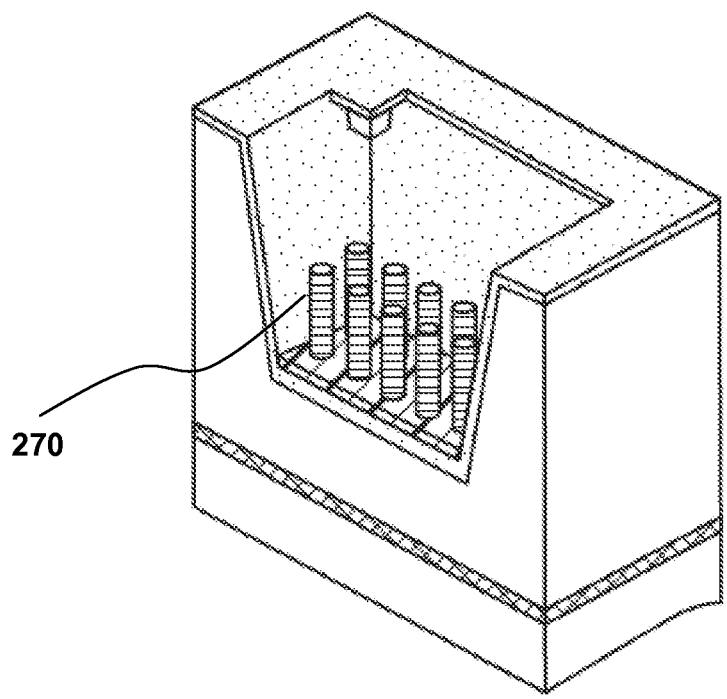
FIG. 2D illustrates a step of growing carbon nanotubes from the catalyst surface, in some embodiments.

Carbon nanotubes 270 are then grown from the catalyst surface, as depicted in FIG. 2D. Carbon nanotubes 270 may be grown by chemical vapor deposition (CVD) in a furnace, by laser ablation, or by plasma-enhanced CVD (PECVD). The temperature of this step is within the range of about 300° C. to about 800° C., such as about 350° C. to about 600° C., in some embodiments.

Figure 2E:
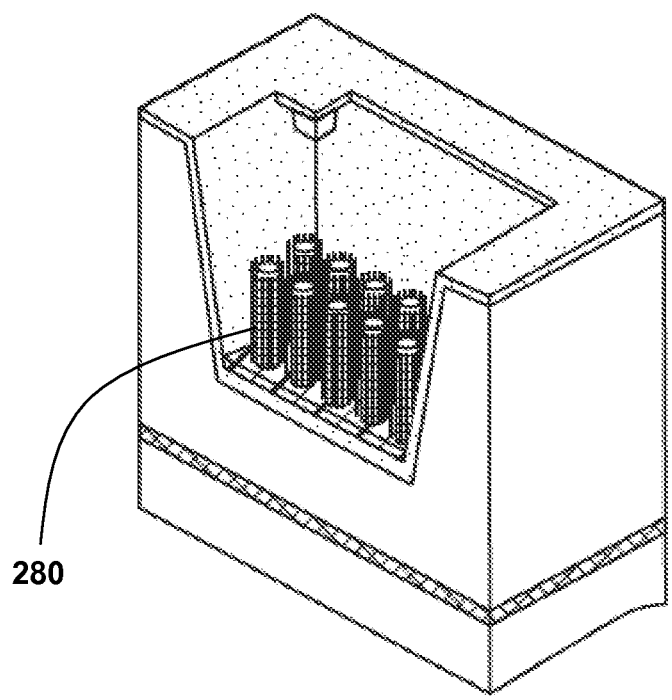
FIG. 2E illustrates a step of depositing ruthenium oxide onto the carbon nanotubes, in some embodiments.

FIG. 2E summarizes the step of depositing ruthenium oxide 280 onto the carbon nanotubes. The ruthenium oxide 280 may be deposited by electrophoretic deposition (electrophoresis), chemical vapor deposition, or cyclic voltammetric deposition, for example. When electrophoretic deposition is employed, it may be enhanced by additives that increase deposition yield and/or mechanical stability of the ruthenium oxide layer. As discussed above, the principles of the present invention are not limited to ruthenium oxide. Other metal oxides may be employed, such as (but not limited to) manganese oxide, nickel oxide, cobalt oxide, tungsten oxide, or vanadium oxide. The metal oxide 280 should be selected for the capability to transport protons and to support high device capacitance and power density.

Figure 2F:
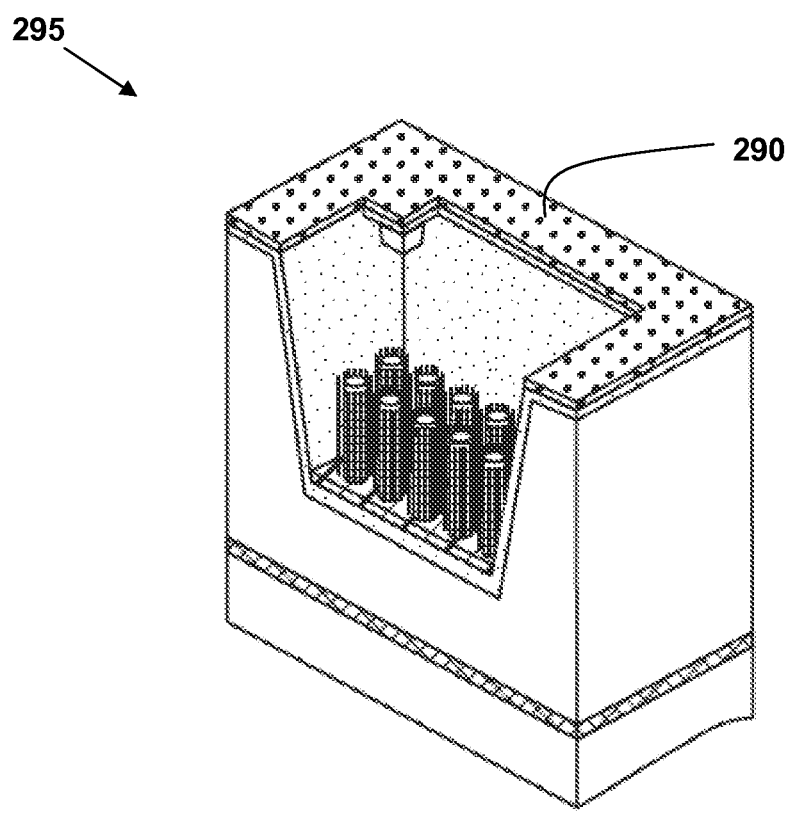
FIG. 2F illustrates a step of applying a bonding material to the border of the cavity, in some embodiments.

A bonding material 290 is applied to the border of the cavity, as shown in FIG. 2F. The bonding material 290 may be applied by a spin-on technique, a sheet and peel method, or a micro-pipette technique. Optionally, the platform 240 for the via 420 may be kept free of the bonding material, although it may be later readily removed from the platform following via formation. After the bonding material 290 is applied to the border of the cavity, the cavity and lid may then be combined later (see FIG. 4A) in a bonding process. Preferably, the bonding material 290 is selected, at least in part, on the basis of the bond seal integrity.

In certain embodiments, the bonding material 290 is a polymeric resin of benzocyclobutene, or biscyclo[4.2.0]octa-1,3,5-triene (also known as "BCB"). Alternatively, or additionally, chemical oligomers, analogs, or derivatives of BCB may be used, such as benzocyclopropene, benzocyclobutadiene, 1,2,5,6-dibenzocyclooctadiene, or divinylsiloxane bis(benzocyclobutene). The bonding material 290 may include commercial resins marketed as CYCLOTENE® (Dow Chemical, Midland, Mich., US), in some embodiments.

In certain embodiments, the bonding material 290 includes epoxy, i.e. a thermosetting polymer formed from the reaction of an epoxide resin with a hardener, such as a polyamine hardener. In some embodiments, the bonding material 290 includes an epoxy resin produced from a reaction between epichlorohydrin and bisphenol-A. When an epoxy is used, the curing may be controlled through temperature, choice of resin and hardener compounds, and the ratio of these compounds.

Figure 3A:
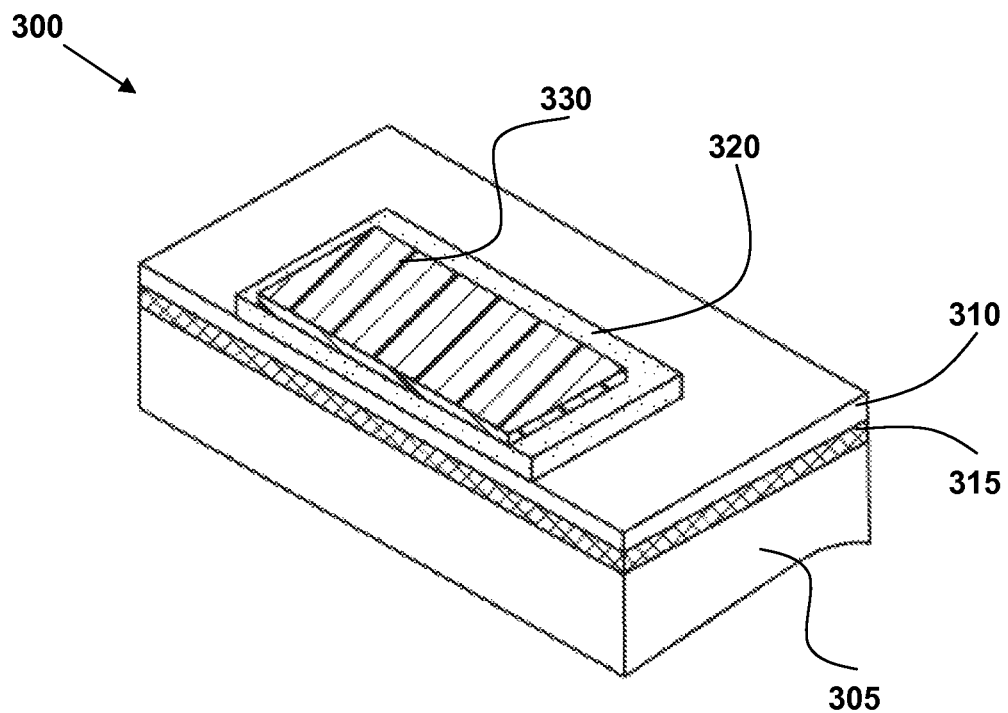
FIG. 3A depicts a step of depositing an electrode metal and then a catalyst for nucleating carbon nanotube growth onto a supercapacitor lid, in some embodiments.
Figure 3B:
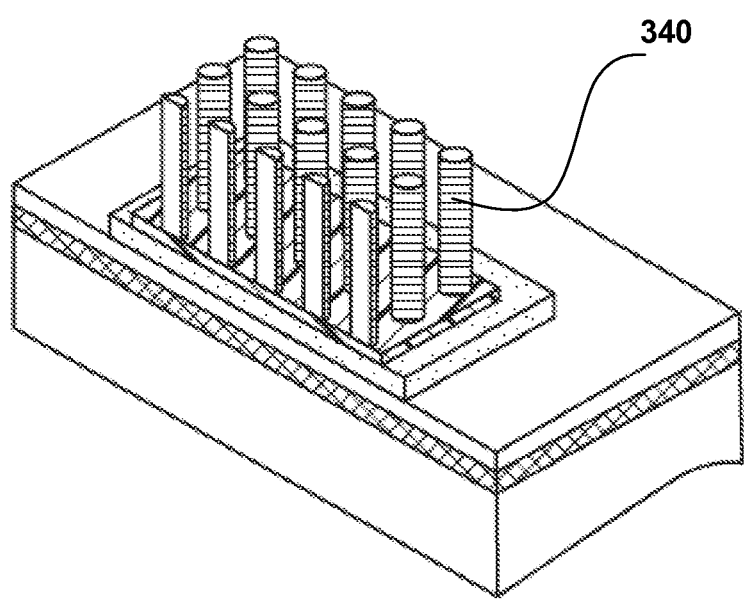
FIG. 3B depicts a step of growing carbon nanotubes from the catalyst surface on the lid, in some embodiments.
Figure 3C:
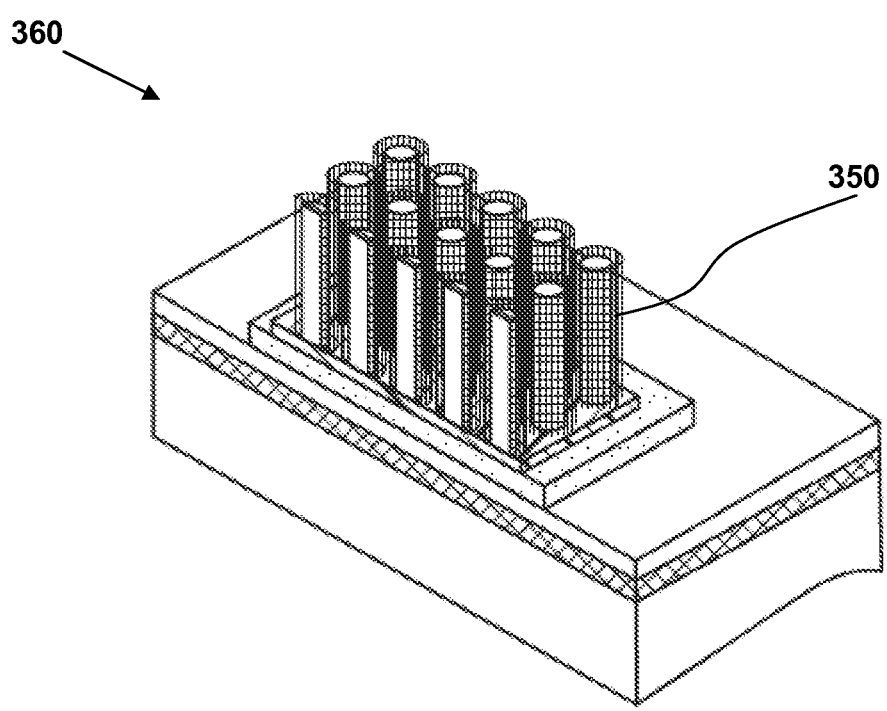
FIG. 3C depicts a step of depositing ruthenium oxide onto the carbon nanotubes grown on the lid, in some embodiments.

Fabrication of a lid wafer 300 (upper electrode) for the supercapacitor is shown in FIGS. 3A-3C which are three-dimensional cross-section sketches illustrating various steps. For convenience of illustration, FIGS. 3A-3C represent a single micro-supercapacitor lid. It should be understood that commercial processing would typically be performed on whole wafers, followed by formation of a plurality of individual micro-supercapacitor lids. Of course, it would be possible to actually perform these steps on partial wafers or even single cells.

The starting material for the lid is an SOI wafer (silicon/$SiO_2$) with a device layer 310 having a thickness of, for example, about 0.5 µm to 5 µm, such as about 1 µm to 2 µm. Although thicker lid layers are certainly possible, it can be preferable to use thin lid layers to minimize the volume of the lid. A lift-off process is applied to deposit an electrode metal (e.g., gold) and then a catalyst (e.g., iron) for nucleating carbon nanotube growth (FIG. 3A). Since the wafer has no topography, electron-beam evaporation is sufficient, for example.

Carbon nanotubes 340 are then grown from the catalyst surface, as depicted in FIG. 3B. Carbon nanotubes 340 may be grown by chemical vapor deposition (CVD) in a furnace, by laser ablation, or by plasma-enhanced CVD (PECVD). The temperature of this step is within the range of about 300° C. to about 800° C., such as about 350° C. to about 600° C., in some embodiments.

FIG. 3C depicts the step of depositing, without implying a limitation, ruthenium oxide 350 onto the carbon nanotubes. The ruthenium oxide may be deposited by electrophoretic deposition (electrophoresis), chemical vapor deposition, or cyclic voltammetric deposition, for example. When electrophoretic deposition is employed, it may be enhanced by additives that increase deposition yield and/or mechanical stability of the ruthenium oxide layer.

Prior to bonding the cavity and lid, the cavity is filled with an electrolyte, such as an electrolyte discussed above. The electrolyte may be introduced using an automated micro-pipette system, in some embodiments. When a solid electrolyte is desired, such as hydrated Nafion®, the solid electrolyte may be introduced in a solvent that is infiltrated into the cavity, followed by placement of the lid and then removal of solvent from the cavity prior to completion of the bonding process. In other embodiments employing solid electrolytes, a fluid electrolyte precursor is infiltrated into the cavity, followed by placement and bonding of the lid. The electrolyte precursor may then be converted to a solid in situ, such as through cooling or reaction. The electrolyte should not be solidified prior to placing the lid, because the carbon nanotubes on the lid layer would not be able to easily penetrate the electrolyte material.

The upper electrode wafer 360 (lid) and lower electrode wafer 295 (cavity) are bonded and sealed to form a supercapacitor. FIG. 4 depicts a fabrication process for completing the device, with the three-dimensional cross-sections in FIGS. 4A-4E relating to various steps. The structure 295 shown in FIG. 2F is combined with the structure 360 shown in FIG. 3C, to form the structure 400 shown in FIG. 4A. Alignment techniques and tools, known in the art, may be employed for this step.

The carbon nanotubes 270 in the cavity are not interspersed with, and preferably do not touch, the carbon nanotubes 340 on the lid. Because the carbon nanotubes in the two electrodes are not in contact with each other, this configuration does not require the presence of a separator. In alternative embodiments, however, a separator may be introduced between the carbon nanotubes 270 of the cavity electrode and the carbon nanotubes 340 of the lid electrode.

Figure 4A:
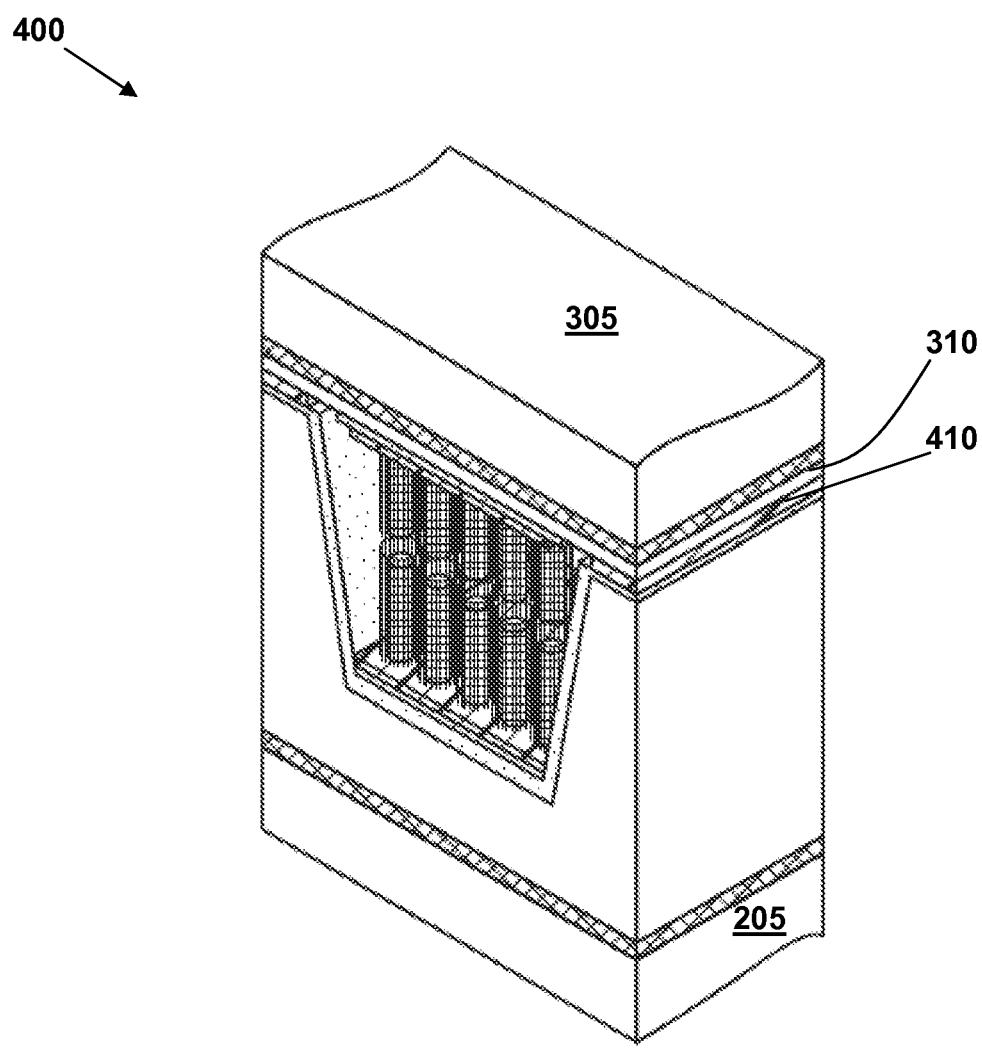
FIG. 4A illustrates a step of aligning and bonding the cavity and lid together, to form a hermetic seal, in some embodiments of the invention.

After the cavity is filled with an electrolyte (not shown), and after the bonding material 290 is applied to the border of the cavity, the cavity and lid are aligned, under suitable bonding conditions to form a seal 410 from the selected bonding material 290 (FIG. 4A). The bonding process may be carried out at room temperature, for convenience, or at other temperatures, such as elevated temperatures for faster bonding. It is preferred that the bonding process forms a hermetic seal 410, or at least a reasonably tight seal. The quality (i.e., integrity) of the seal 410 will depend on the choice of bonding material 290 as well as on the bonding conditions.

As intended herein, a "hermetic seal" means a seal that substantially prevents the entry of air, water vapor, and foreign bodies into the supercapacitor. Minor amounts of contaminants, such as oxygen, nitrogen, carbon dioxide, or water, may technically be able to pass through the seal (e.g., at very slow kinetic rates of diffusion or permeation) but should not statistically reduce the performance of the supercapacitor.

Figure 4B:
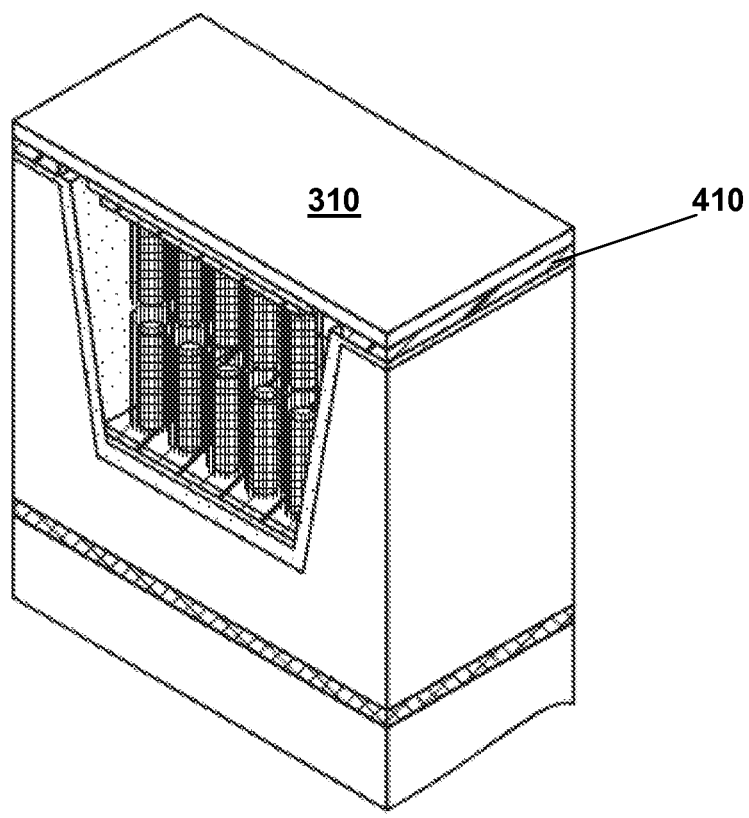
FIG. 4B illustrates a step of removing silicon substrate and buried silicon dioxide from the lid layer, in some embodiments.

Next, the silicon substrate 305 from the lid layer is removed with a wet or dry etch that exhibits high silicon selectivity compared to silicon dioxide (insulator layer), e.g., deep reactive ion etching. The $SiO_2$ 315 (buried oxide) may be removed with a selective wet oxide etch. The resulting structure is shown in FIG. 4B.

Figure 4C:
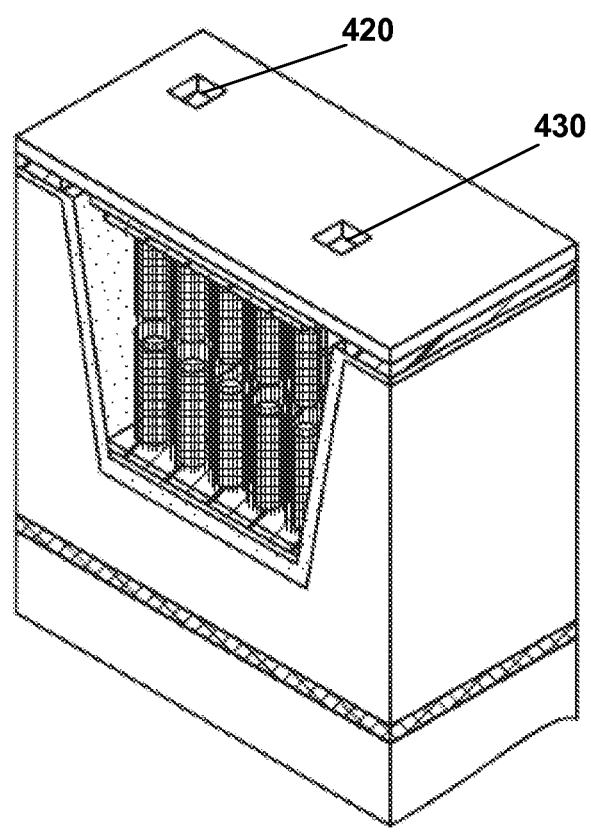
FIG. 4C illustrates a step of etching vias into the silicon on the top surface of the lid, in some embodiments.

As depicted in FIG. 4C, vias 420, 430 are patterned and etched (for example, by deep reactive ion etching) into the silicon 310. The lower-electrode via 420 will terminate on the bonding material layer 290 and the upper electrode via 430 will terminate on the lid's underlying metal film 320. Some bonding material film inside the lower electrode via 420 can be removed with an oxygen plasma, for example, to reveal the lower-electrode metal on the cavity border 250 (or, in some embodiments, on the small border platform 240).

Figure 4D:
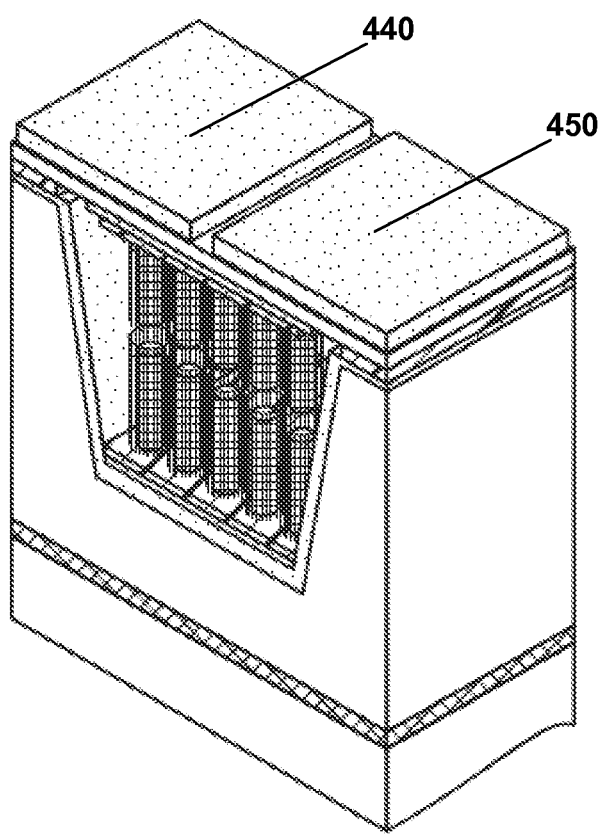
FIG. 4D illustrates a step of depositing metal to form connections to the upper and lower electrodes, in some embodiments.

Metal is then patterned and deposited to form connections 440, 450 to the upper and lower electrodes (FIG. 4D). Since both of the electrodes terminate on the top surface 310, the supercapacitor cells may be connected easily in series or in parallel by adding another metal layer.

Figure 4E:
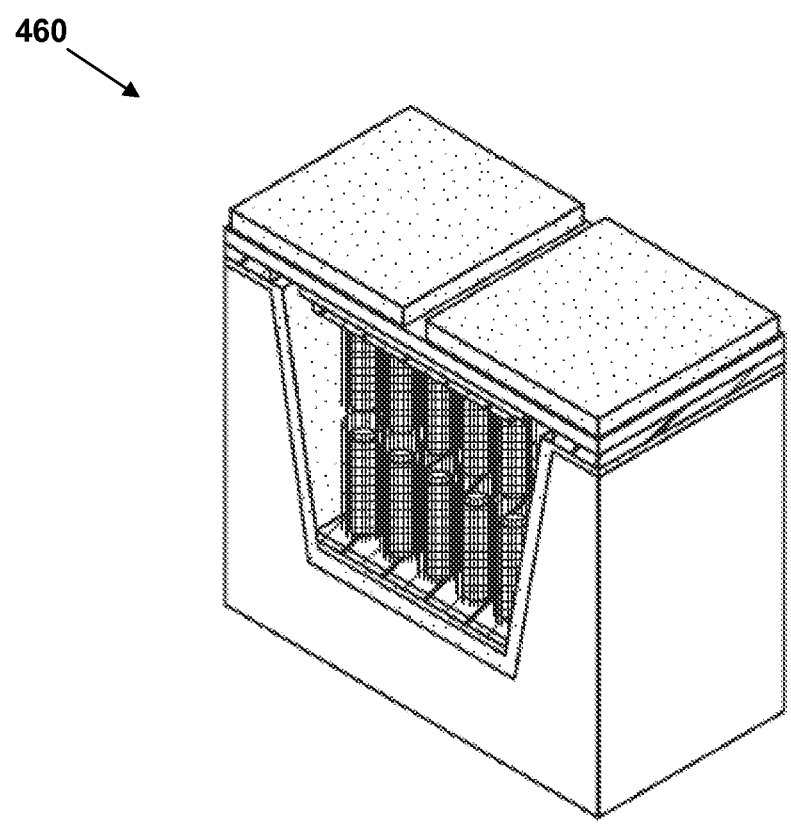
FIG. 4E illustrates a step of removing the silicon substrate and buried silicon dioxide from the cavity wafer, in some embodiments of this invention.

Finally, as shown in FIG. 4E, the substrate layer 205 from the cavity wafer is removed with a selective etch, followed by removal of the buried oxide 215. The resulting structure 460 is a supercapacitor cell. If processing was done on an individual cell, then the resulting structure 460 in FIG. 4E is a functional micro-supercapacitor. Note that the supercapacitor cell (or micro-supercapacitor) does not contain a separator, which increases the working volume and energy density of the device.

When processing is done on whole wafers, individual supercapacitor cells may then be delineated, with various dimensions. This step could be performed at a separate location and at a future time. The supercapacitor cells can have various geometries, such as cubes or trenches (i.e. depth larger than cavity width). The specific dimensions of the cell will be determined during processing. When it is desired to have deep wells, the starting cavity SOI wafer will need to have a relatively thicker device layer.

In some embodiments, a micro-supercapacitor fabricated according to the present invention has at least one (i.e., one, two, or all three) dimensions less than about 1 mm. In some embodiments, the micro-supercapacitor has at least two dimensions less than about 1 mm. In some embodiments, all three dimensions of the micro-supercapacitor are less than about 1 mm.

In some embodiments, a micro-supercapacitor fabricated according to the present invention has at least one (i.e., one, two, or all three) dimensions equal to or less than about 100 µm. In some embodiments, the micro-supercapacitor has at least two dimensions equal to or less than about 100 µm. In some embodiments, all three dimensions of the micro-supercapacitor are equal to or less than about 100 µm.

For example, the micro-supercapacitors may be fabricated as cubes, or substantially cubic cells, with dimensions of 100 µm×100 µm×100 µm. In some embodiments, the micro-supercapacitors are cubic cells with dimensions of 50 µm×50 µm×50 µm. In various embodiments, the micro-supercapacitors are cubic cells with cube lengths selected from about 10 µm to about 100 µm.

The micro-supercapacitor may have a relatively deep well (distance from lid to bottom surface of cavity). In some embodiments, the micro-supercapacitor has a depth-to-width ratio of greater than 1, such as about 2, 3, 4, 5, 10, 20, 30, 40, 50 or more.

For good energy density, the volume of the cavity should be a significant fraction of the total volume of the micro-supercapacitor. In some embodiments, the cavity (not including the metals and nanostructures therein) forms at least 20%, 30%, 40%, 50% or more of the total micro-supercapacitor volume.

The energy density of the resulting micro-supercapacitor, according to the invention, may vary. In some embodiments, the energy density is at least about 100 $J/cm^3$, 125 $J/cm^3$, 150 $J/cm^3$, 175 $J/cm^3$, 200 $J/cm^3$ or more, where the volume basis is the total micro-supercapacitor volume.

The power density of the resulting micro-supercapacitor, according to the invention, may vary. In some embodiments, the peak output power density is in the range of about 2-20 $W/cm^3$ or more, such as about 3, 5, 10, 15, or 20 $W/cm^3$, where the volume basis is the total micro-supercapacitor volume.

Variations of this invention have a wide variety of commercial uses. Exemplary uses include high-speed electronic applications that require on-chip power supplies to prevent local current starvation, backup power supplies for memories, microsensors, microcomputers, clocks, battery augmentation, wireless communication devices, power tools, robotic applications, airframe and vehicle health monitoring, battlefield surveillance, electric vehicle hybrid power systems, pulse power applications, and back-up emergency power supplies.

In this description, reference has been made to multiple embodiments and to the accompanying drawings in which are shown by way of illustration specific exemplary embodiments of the invention. These embodiments are described in sufficient detail to enable those skilled in the art to practice the invention, and it is to be understood that modifications to the various disclosed embodiments may be made by a skilled artisan.

Where methods and steps described above indicate certain events occurring in certain order, those of ordinary skill in the art will recognize that the ordering of certain steps may be modified and that such modifications are in accordance with the principles of the invention. Additionally, certain steps may be performed concurrently in a parallel process when possible, as well as performed sequentially.

All publications, patents, and patent applications cited in this specification are herein incorporated by reference in their entirety as if each publication, patent, or patent application were specifically and individually put forth herein.

The embodiments, variations, and figures described above provide an indication of the utility and versatility of the present invention. Other embodiments that do not provide all of the features and advantages set forth herein may also be utilized, without departing from the spirit and scope of the present invention. Such modifications and variations are considered to be within the scope of the principles of the invention defined by the claims.

What is claimed is:

1. A method of fabricating a supercapacitor, said method comprising:
   (a) etching a first silicon-on-insulator wafer to form a cavity and a cavity border surface;
   (b) depositing a first electrode interconnect metal onto the internal surface of said cavity and onto said cavity border surface;
   (c) depositing, at the bottom of said cavity and onto a portion of said first electrode interconnect metal, a first catalyst layer for catalyzing growth of carbon nanostructures;
   (d) depositing, onto the surface of a second silicon-on-insulator wafer, a second electrode interconnect metal and a second catalyst layer, to form a lid layer;
   (e) growing carbon nanostructures on said first catalyst layer and on said second catalyst layer;
   (f) depositing a metal oxide onto the outer surfaces of said carbon nanostructures;
   (g) introducing an electrolyte or electrolyte precursor into said cavity;
   (h) applying a bonding material between said cavity border surface and said lid layer;
   (i) aligning said lid layer with said cavity border surface under suitable bonding conditions for said bonding material to form a hermetic seal;
   (j) removing lid silicon substrate and lid insulator from said lid layer;
   (k) etching a first electrode via and a second electrode via in said lid layer, wherein said first electrode via exposes said first electrode interconnect metal on said cavity border surface and said second electrode via exposes said second electrode interconnect metal; and
   (l) depositing a first electrode metal terminal and a second electrode metal terminal on said lid layer.

2. The method of claim 1, wherein said carbon nanostructures are selected from the group consisting of nanotubes, nanohorns, nanowires, nanofoams, nanoribbons, nanofibers, buckytubes, extruded activated carbon, oriented pyrolytic graphite, aerogels, graphene sheets, and any combinations thereof.

3. The method of claim 2, wherein said carbon nanostructures are single-wall carbon nanotubes.

4. The method of claim 1, wherein said metal oxide is selected from the group consisting of ruthenium oxide, manganese oxide, nickel oxide, cobalt oxide, tungsten oxide, vanadium oxide, and any combinations thereof.

5. The method of claim 1, wherein said bonding material is selected from the group consisting of benzocyclobutene, benzocyclopropene, benzocyclobutadiene, 1,2,5,6-dibenzocyclooctadiene, divinylsiloxane bis(benzocyclobutene), an epoxy, and any combinations thereof.

6. The method of claim 1, wherein bonding is carried out at a temperature less than about 40° C.

7. The method of claim 1, wherein said etching in step (a) includes formation of a via platform within said cavity border surface, wherein said via platform connects said first electrode via to said first electrode interconnect metal.

* * * * *